Aug. 29, 1961 C. E. MAIDEN ET AL 2,998,558

SEMICONDUCTOR DEVICE AND METHOD OF MANUFACTURING SAME

Filed Oct. 19, 1959

CLINTON E. MAIDEN,
DONNA A. GERMAN,
INVENTORS.

BY Spensley and Horn

ATTORNEYS.

United States Patent Office 2,998,558
Patented Aug. 29, 1961

2,998,558

SEMICONDUCTOR DEVICE AND METHOD OF MANUFACTURING SAME

Clinton E. Maiden, Canoga Park, and Donna A. German, Hawthorne, Calif., assignors to Pacific Semiconductors, Inc., Culver City, Calif., a corporation of Delaware Filed Oct. 19, 1959, Ser. No. 847,354
4 Claims. (Cl. 317—234)

This invention relates to semiconductor devices and to a method of manufacturing such devices. More particularly, this invention relates to an improved encapsulation for such devices and a method of forming such encapsulation.

In the prior semiconductor art many different forms of packages have been evolved for encapsulating semiconductor diodes. The packages have been composed of metal, plastic, ceramic, glass and various combinations of these elements. It has been recognized in the semiconductor art that a hermetically sealed package wherein the semiconductor is mounted within a miniaturized housing, the central region of which is composed of glass affords a foundation for defining an ideal package.

A proper encapsulation for semiconductor devices must possess a number of defined electrical characteristics. The encapsulation or housing must form a hermetic seal about the crystal element of the semiconductor device mounted therein to protect the device from the adverse effects of ambient moisture. This particular requirement is especially critical when the crystal element of the semiconductor device is composed of an intrinsic semiconductor such as germanium or silicon, which is particularly sensitive to even slight increases in humidity.

Another characteristic essential to the ideal semi-conductor package is that its overall dimensions must be relatively small while nevertheless permitting relatively large power dissipation by the device. The dimensional requirement of the semiconductor devices has been continually moving to small size of the device such that a semiconductor device encapsulated by methods of the prior, but recent, art is considerably too large in size for some required applications to which the semiconductor devices are now put.

A further necessary or desirable feature of semiconductor encapsulating means is that the encapsulation must be of simple design and mechanically rugged. More specifically, it should be able to withstand severe shocks without breakage or mutilation and be capable of being incorporated into electrical circuits with a minimum of effort and time. The mechanical properties of the encapsulation must be such as to prevent variations of the electrical characteristics of the completed device due to dimensional variations and/or strains caused by changes in the temperature of the housing components and variations in the ambient humidity. In addition, the method and steps to use in encapsulating the device must be such that the device itself is not affected in any manner which is detrimental to its electrical or physical properties. For example, the method of encapsulating a semiconductor device must be such that the steps utilized in the encapsulation do not effect any of the various bonds between the different components of the device, such as the mechanical bonds between the lead wires and the crystal of the device.

Prior art devices are typically housed in packages which involve a glass-to-metal seal requiring close manufacturing tolerances. Such crystal devices are expensive to manufacture and are sometimes not as reliable as is desired in the art of miniaturization as it has recently developed in the electronics industry. It has been found necessary to reduce still further in size glass-to-metal packages housing the semiconductor devices. Since the active crystal element of a semiconductor diode, for example, amounts to a very small fraction of the total volume of the completed package, it is clear that as the volume of the package approaches that of the crystal, the more nearly will optimum miniaturization be achieved.

In the semiconductor art, a region of semiconductor material containing an excess of donor impurities and yielding an excess of free electrons is considered to be an impurity doped N-type region. An impurity doped P-type region is one containing an excess of acceptor impurities resulting in a deficit of electrons or an excess of holes. Stated differently, an N-type region is one characterized by electron conductivity whereas a P-type region is one characterized by hole conductivity. When a continuous solid crystal specimen of semiconductor material has an N-type region adjacent a P-type region, the boundary between the two regions is termed a P-N or N-P junction or simply a junction. Such a specimen of semiconductor material is termed a junction semiconductor device and may be used as a rectifier. A solid crystal specimen having two such junctions is termed a transistor. In addition to the junction type semiconductor device the point contact type and diffused junction type semiconductor devices are also well known to the art.

Accordingly, it is an object of the present invention to provide an improved semiconductor hermetically sealed device.

It is another object of the present invention to provide a semiconductor device, the overall size of which approaches that of the active crystal elements of the device.

It is a further object of the present invention to provide a very small semiconductor device, the mechanical stability of which is greater than has been heretofore possible.

Yet another object of the present invention is to provide a very small semiconductor device of increased mechanical and electrical reliability.

It is yet a further object of the present invention to provide an improved method and means for encapsulating semiconductor devices which method and encapsulation means are particularly adapted to mass production techniques.

A still further object of the present invention is to provide an encapsulation for semiconductor diodes and a method of producing the same which encapsulation is economical of production while being rugged in use.

It is still a further object of the present invention to provide an encapsulation for semiconductor devices which furnishes increased reliability of the device in both electrical and mechanical properties.

Yet a further object of the present invention is to provide an encapsulation for semiconductor devices which makes possible the production of semiconductor devices having overall dimensions which are less than those heretofore possible by encapsulation means of the prior art.

A still further object of the present invention is to provide an encapsulation for semiconductor devices which hermetically seals the semiconductor devices efficiently.

It is still a further object of the present invention to provide a method for hermetically encapsulating semiconductor devices which method is particularly adapted to mass production techniques, being simple and economical of manufacture.

An encapsulated semiconductor device produced in accordance with the present invention comprises a semiconductor device having first and second lead wires extending therefrom. A quantity of glass is coated upon the semiconductor device completely surrounding such device and said lead wires to a point spaced away from said device. The quantity of glass coating the device and a portion of the lead wires is in hermetically sealing contact with the lead wires such that the device is hermetically sealed from the atmosphere. The method of the present invention for producing such devices comprises the steps of forming a molten quantity of low-melting temperature glass; maintaining the glass in a molten condition at a temperature less than the temperature at which any of the components of the semiconductor device are softened or damaged; dipping the semiconductor device into the molten quantity of glass to surround the semiconductor device and a portion of the lead wires extending therefrom with molten glass; removing the dipped device from the molten glass thereby depositing a quantity of glass surrounding the semiconductor device and in hermetic sealing contact with the lead wires extending therefrom, and allowing the glass to solidify upon the device.

The novel features which are believed to be characteristic of the present invention, both as to its organization and method of operation, together with further objects and advantages thereof, will be better understood from the following description considered in connection with the accompanying drawing in which a presently prefrred embodiment of the invention is illustrated by way of example. It is to be expressly understood, however, that the drawing is for the purpose of illustration and description only, and is not intended as a definition of the limits of the invention and that the true spirit and scope of the invention is defined by the accompanying claims.

Figure 1:
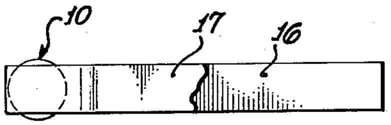
FIGURE 1 is a plan view, partly in section, and greatly out of scale for purposes of clarity, of an illustrative semiconductor device prior to encapsulation by means of the present invention.
Figure 2:
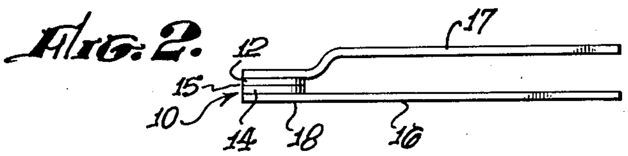
FIGURE 2 is a view in elevation corresponding to FIGURE 1.

Referring now to the drawing, there is shown in FIGURE 1 a bare semiconductor diode device of an illustrative type to which the encapsulating method and means of the present invention is particularly applicable and desirable. The device shown in FIGURE 1 is greatly enlarged and exaggerated in scale for purposes of clarity as will become apparent in view of typical dimensions given hereinafter. In this illustrative semiconductor device a diffused silicon crystal 10 forms the active semiconductor crystal with a P-type region and an N-type region at opposite surfaces thereof. For purposes of illustration the semiconductor body 10 is of silicon and includes a P-type conductivity region 12 and an N-type conductivity region 14 separated by a P-N junction 15. The P-N junction can be produced by any method known to the art, such as diffusion, for example. It should be pointed out, that while this invention is generally described with reference to P-N junction devices, it is equally applicable to semiconductor electrical translating devices which do not necessarily include a P-N junction but which nevertheless provides rectification at a barrier such as by the deposition of a film on the surface of a semiconductor body. In the illustrative embodiment shown, flat ribbon leads 16, 17 are bonded directly to the opposite surfaces of the crystal 10. The ribbon leads 16, 17 are substantially equal in width to the width of the crystal and are bonded throughout the length of the crystal. Accordingly, when the leads are bonded to opposite surfaces of the crystal only the edges 18 and outer chord surfaces of the crystal remain exposed. Although ribbon leads bonded directly to the crystal surfaces are shown as illustrative, other bare diode configurations can be used and the leads 16, 17 can be round or shaped otherwise than as flat ribbons. Bonding of the leads to the crystal can be accomplished by methods well known to the art. In the embodiment shown, gold-plated nickel leads are used to utilize a material which can be satisfactorily bonded or alloyed with the silicon crystal. That is, the crystal and leads are heated to a temperature sufficient to cause alloying between the silicon and the gold to produce a gold-silicon eutectic or an alloy region.

Utilizing a bare semiconductor device such as the illustrative device described above, the device is encapsulated in accordance with the present invention by surrounding the active portions of the device with a quantity of glass. In some instances it may be desirable to precoat the devices with a glass compatible material such as a thin layer or coating of polymeric organo-siloxane. That is, in connection with the bare diode shown it is sometims advantageous, in order to compensate for differences in coefficients of thermal expansion of the glass and semiconductor material, and to provide a junction protectant film chemically bonded to the semiconductor surface, to coat the device and particularly the exposed edges of the crystal with a polysiloxane film in accordance with the methods described and claimed in co-pending United States patent application entitled "Improved Surface Treatment of Semiconductor Bodies" by Allan L. Harrington and Stanley Pessok, Serial No. 749,624, and United States patent application entitled "Method and Means for Forming Passivation Films on Semiconductor Bodies" by Allan L. Harrington and Stanley Pessok, Serial No. 749,620, now Patent No. 2,913,358, both assigned to the assignee of the present invention. More particularly, a relatively thick polysiloxane film can be produced by molecularly bonding the film to the exposed silicon edge surfaces. The film can be built up to any thickness desired and for the purpose of this invention thickness ranging from 25 to 250 microns will normally be adequate.

In order to produce the relatively thick film a pre-esterified semiconductor surface, herein silicon, for purposes of example, is reacted with polyfunctional organosilicon monomers to produce a cross-linked or space polymers integrally bonded to the silicon surface. The major reactive ingredient in the polymerization reaction is a tri-functional organo-silicon compound having the general formula: $RSiX_3$ where R is a monovalent hydrocarbon radical (e.g., methyl, ethyl, phenyl, epoxy, vinyl, nitrile, etc.) and X is a reactive group capable of propagating a chain and cross-linking it to other chains. Among the many examples of suitable compounds are ethyl triethoxy silane, methyl triethoxy silane, phenyl trihydroxy silane, and the like.

In addition to the tri-functional compound, various amounts of di-functional and/or mono-functional organosilicon monomers are included to modify the mechanical and electrical properties of the resulting cross-linked polymer.

The underlying relatively thin film comprising an ester of the silicon material which is integrally and chemically bonded to the silicon surface can be formed by the method described and claimed in copending United States application Serial No. 749,624, supra. The subassembly is immersed in an etch solution containing hydrofluoric acid as a principal element for a length of time sufficient to remove foreign matter, contaminants and work damage from the surface of the crystal body. The etch solution contains, for example, two parts by volume of hydrofluoric acid (about 40% concentration in water) and one part of nitric acid (about 90% concentration in water). The subassembly is then removed from the etch and immersed in a quench solution comprising primarily an organic liquid which has in its chemical structure a reactive hydroxyl group, broadly designated herein as $R(OH)_x$ specifically, a monohydric or polyhydric aliphatic alcohol containing from 1 to 4 carbon atoms per molecule. A 95% ethanol solution is particularly preferred. It is necessary to transfer the subassembly including the silicon body quickly from the etch solution to the quench solution to prevent undue exposure to the ambient. Briefly, hydrofluorsilicic acid ($H_2SiF_6$) formed at the silicon surface when the body is immersed in the quench solution will react with the $R(OH)_x$ at the silicon surface to form ester groups which are molecularly bonded with the silicon as a film upon the silicon surface. The film is less than 1 micron and normally on the order of 100 to 1000 angstrom units in thickness. Quenching times ranging from about 5 seconds to 5 minutes may be suitably employed.

After formation of the relatively thin film comprising an ester of the underlying semiconductor material (i.e., silicon), an underlying coating of polymeric organo siloxane can be formed by reacting the ester groupings and the surface of the semiconductor material, in the thin film formed thereon, with a mixture comprising trifunctional silane monomers and mono or di-functional monomers, or both, in predetermined proportion, together with reactive and inert catalysts as described in detail hereinafter. The body is immersed in the liquid monomeric mixture in this embodiment and the mixture is agitated to insure complete wetting of the surface. Other methods of wetting can, of course, be utilized as long as the wetting action is complete.

The esterified film is reacted with a mixture of organosilane compounds, in which a trifunctional monomer predominates. The reactive group X of such monomers having the formula $RSiX_3$ can be any of a wide variety. The most reactive is the hydroxyl group but trihydroxy compounds have the disadvantage that they rapidly autopolymerize. Consequently, it is preferred to use, as a starting material, a tri-alkoxy compound such as ethyl triethoxy silane and hydrolyze the alkoxy compound to the hydroxy compound just prior to use. Such hydrolysis can be effected in a medium of water, amyl alcohol, toluene (which is a solvent for the hydrogen chloride) which acts as a catalyst.

The reactive groups can also be groups such as mercapto, amino, or halide groups. These groups are not quite so effective as the preferred alkoxy or hydroxy substituted silanes. Chloride groups, for example, form only relatively thin passivating films, whereas alkoxy and hydroxy compounds can be used to build up polymers of any desired thickness.

The addition of difunctional organo-silanes ($R_2SiX_2$) where R and X have the same definition as previously, increases the plasticity of the resulting cross-linked polymer. Diphenyl silane diol is particularly useful in this respect. Where the tri-and di-functional monomers are used alone, the ratio of tri- to di-functional compounds in the reaction mixture will be about 10 to 50% di-functional compound, and the balance tri-functional.

The addition of mono-functional organo-silanes ($R_3SiX$) serves to provide chain-terminating groups on the cross-linked polymer. When used in combination with the tri-functional compound alone, the monfunctional compound may be present in amounts of 1 to 10% by weight.

The mono-functional compounds may be added per se, as is the case of triphenyl silanol, or they may be added in a form which yield mono-functional groups in the reaction medium. The addition of hexamethyl siloxane which disassociates into trimethyl silanes is an example of the latter.

When all three types of silane monomers are employed, the preferred amounts of each in the reaction mixture will be as follows:

| | |
|---|---|
| Mono-functional | 1–5% by weight. |
| Di-functional | 5–45% by weight. |
| Tri-functional | Balance. |

In accordance with the method of the present invention the glass encapsulation can be applied directly to the bare diode without the prior formation or deposition of a coating or film. Whether a bare device, one having an esterified thin film only, or one having a coating of polymeric organo-siloxane is encapsulated depends upon the precise physical, chemical and electrical characteristics of the glass, film, and semiconductor material used. For example, for certain glasses the useful operative temperature range is limited by the difference in coefficient of thermal expansivity. In some cases the glass may be applied directly to the bare diode to package a device with suitable performance characteristics. In other cases the intermediate film may be used as buffer layer which can compensate for certain differences in properties of the glass and semiconductor materials.

Figure 3:
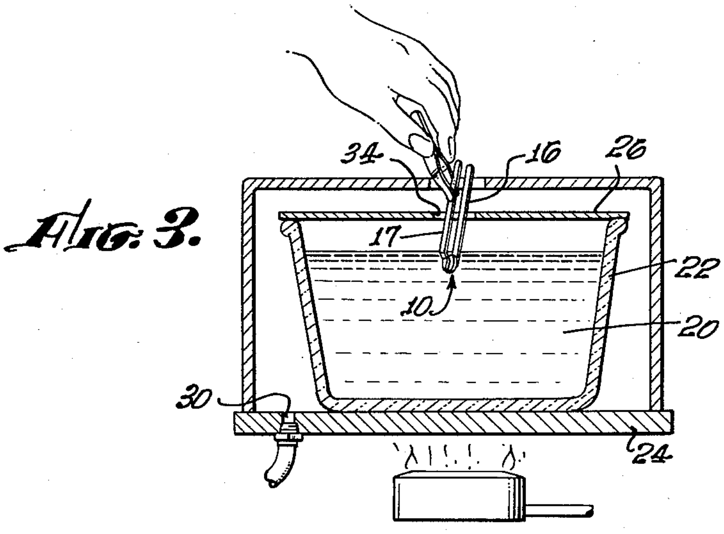
FIGURE 3 is a view, partly in section, diagrammatically showing the semiconductor device of FIGURE 1 being dipped into the molten glass in accordance with the present invention.
Figure 4:
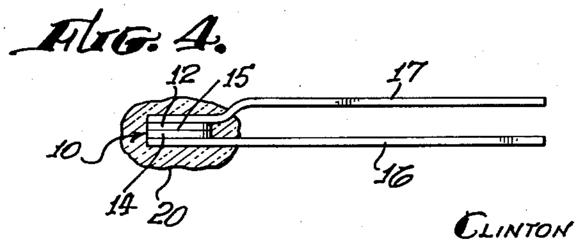
FIGURE 4 is a view, partly in section, showing the completed encapsulated semiconductor device.

Referring now to FIGURES 3 and 4, the bare diode of FIGURE 1 is encapsulated by dipping in molten glass. In the illustrative embodiment shown a relatively thin esterified film as described above is formed on the exposed silicon surfaces. The leads 16, 17 are preferably bent away from the longitudinal center line of the device and toward parallelism with one another. In this form the diode is dipped beneath the surface of molten glass to a depth sufficient to completely surround the active portions of the device as shown in FIGURE 3 and described hereinafter. The properties and characteristics of the glass are described in detail following; however, at this point it is important to note that the dipping temperature of the glass must be sufficiently low to prevent damage to the device electrically or mechanically as by loosening the bond between the leads 17, 16 and crystal 10. The most satisfactory dipping temperature of presently preferred devices is approximately 300° with a maximum of 350° C. The viscosity of the molten glass must be such that at the dipping temperature a thorough wetting of the device surfaces, including the leads, by the molten glass takes place. In addition the viscosity must be sufficiently low that only a thin film of glass is deposited. Further, the softening point of the glass must be sufficiently high to remain reasonably hard at high operating temperatures of the completed device which may reach 150° C. to 200° C.

Various low melting temperature glasses have been developed for use in connection with the present invention, one of the most satisfactory being glass having the composition of approximately 30% arsenic, 36% thallium and 34% sulfur. The viscosity of such glass is 10 to 100 centipoises at 250° C. to 300° C., with a softening point of $10^{7.6}$ poises at 150° C. to 200° C. A dipping temperature of 300° C. is used and the device dipped for approximately three seconds. Other suitable glasses include those comprising 15–20% arsenic, balance sulfur; 38% arsenic, balance sulfur; and 5% thallium, 35% arsenic, balance sulfur.

The term "glass" as is recognized usually is thought of as a material of amorphous structure and containing silicates. The term "glass," however, as used herein should be defined as an organic product of fusion which has been cooled to a rigid condition without crystallization and may not necessarily include any silicates whatsoever as indicated by the examples hereinabove mentioned.

Referring now particularly to FIGURE 3, as an illustration of the method of the present invention, a quantity of the above described low melting temperature glass 20 comprising 30% arsenic, 36% thallium and approximately 34% sulfur is placed in a Vycor crucible 22 and raised to dipping temperature. For example, the crucible is placed upon a stainless steel plate 24 with a second stainless steel plate 26 placed over the top of a glass cylinder 28 which in turn surrounds the crucible. The first stainless steel plate is placed over a burner and a thermocouple for measuring the temperature of the hot melt is introduced through a hole in the first bottom plate. Argon is admitted to the enclosed cylinder through a hole 30 which is also supplied through the bottom plate. An argon flow rate of the order of 10 cubic feet per hour is suitable to maintain the argon atmosphere in a vessel having a capacity of approximately 1.5 cubic feet. After the glass in the crucible is brought to a molten condition and maintained at a dipping temperature of approximately 300° C., a bare diode having an esterified surface film thereon, with the leads bent as described hereinbefore, is inserted through an opening 34 in the center of the top plate by means of tweezers or a similar holding tool. The diode is dipped to a depth at which the crystal 10 and lead wires proximate the crystal are submerged. The diode is held in the molten glass for a time sufficient to insure good wetting of the diode. In this illustrative embodiment a dipping time of approximately three seconds was utilized. As an example of the relative sizes of parts and components, the crystal shown in the drawings is .020 inch in diameter and .006 inch in thickness with gold-plated nickel leads .003 inch in thickness by .016 inch in width and one-half inch long.

By the dipping method and time described above a glass coating is deposited upon the bare diode and the diode is removed from molten glass. The coating is of the order of .020 inch to .030 inch in thickness. The dipped glass encapsulation for semiconductor devices formed in accordance with this invention is particularly adapted to the production of devices in which the package size is to be maintained at a diameter of approximately .080 inch to .100 inch and a length of .200 inch to .250 inch in width.

It has been found that semiconductor devices prepared in accordance with the present invention whereby the devices are encapsulated with a coating of glass directly applied to the device, possess electrical characteristics equal to and in many instances superior to the electrical properties and characteristics of devices formed in much larger package.

In connection with some uses of semiconductor devices wherein the device will be subjected to severe mechanical abuse it is sometimes necessary or desirable to apply a protective coating over the glass encapsulation. Such a coating can be formed, for example, by applying a film of epoxy resin over the glass encapsulation.

Thus, the present invention provides an improved hermetically sealed semiconductor device which is sufficiently small in size that it approaches in overall size the size of the active crystal element.

What is claimed as new is:

1. An encapsulated semiconductor device comprising: an active crystal element of semiconductor material, said active crystal element including a preesterified film of said material formed on the surface of said crystal element, lead wires affixed to and extending from said crystal element, a deposited coating of glass surrounding said crystal element and a portion of said lead wires adjacent said crystal element, said glass having a relatively low temperature melting point below the damage temperature of said crystal element and lead wires, said deposited coating of glass being in hermetic sealing contact with said crystal element and said lead wires, said glass coating being of sufficient thickness to prevent the passage of moisture therethrough.

2. An encapsulated semiconductor device comprising: an active silicon crystal element, said active crystal element including a preesterified film of silicon formed on the surface of said crystal element, lead wires affixed to and extending from said crystal element, a deposited coating of glass surrounding said crystal element and a portion of said lead wires adjacent said crystal element, said glass having a relatively low temperature melting point below the damage temperature of said crystal element and lead wires, said deposited coating of glass being in hermetic sealing contact with said crystal element and said lead wires, said glass coating being of sufficient thickness to prevent the passage of moisture therethrough.

3. An encapsulated semiconductor device comprising: an active silicon crystal element, said active crystal element including a pre-esterified film of silicon formed on the surface of said cryystal element; lead wires affixed to and extending from said crystal element; a coating of polymeric organo-siloxane formed on said crystal element and said pre-esterified film; a deposited coating of glass surrounding said crystal element, said polymeric organosiloxane coating and a portion of said lead wires adjacent said crystal element, said glass having a relatively low temperature melting point below the temperature at which said crystal element, polymeric coating and lead wires are damaged or separated from the other.

4. An encapsulated semiconductor device comprising: an active crystal element of said semiconductor material having opposed substantially parallel planar surfaces; first and second lead wires each having an end portion with a substantially planar surface, said planar surface of said lead wires being ohmically affixed to said opposed surfaces of said crystal element respectively; a preesterified film of said semiconductor material surrounding said crystal element and the portion of said lead wires adjacent said crystal element; a deposited coating of glass surrounding said crystal element and a portion of said lead wires adjacent said crystal element, said glass having a relatively low temperature melting point below the damage temperature of said crystal element and lead wires, said deposited coating of glass being in hermetic sealing contact with said crystal element and said lead wires, said glass coating being of sufficient thickness to prevent the passage of moisture therethrough.

References Cited in the file of this patent

UNITED STATES PATENTS

| | | |
|---|---|---|
| 2,702,879 | Wheeler | Feb. 22, 1955 |
| 2,827,597 | Lidow | Mar. 18, 1958 |
| 2,842,725 | Muller | July 8, 1958 |